United States Patent [19]
Yamada et al.

[11] Patent Number: 5,201,009
[45] Date of Patent: Apr. 6, 1993

[54] SIGNAL PROCESSOR

[75] Inventors: Yusuke Yamada; Tetsuya Murayama, both of Itami, Japan

[73] Assignee: Mitsubishi Denki Kabushiki Kaisha, Tokyo, Japan

[21] Appl. No.: 764,845

[22] Filed: Sep. 24, 1991

[30] Foreign Application Priority Data

Mar. 18, 1991 [JP] Japan .................................. 3-052623

[51] Int. Cl.[5] .............................................. H03G 3/00
[52] U.S. Cl. ..................................... 381/104; 381/106; 381/98; 381/94; 333/28 T; 330/284; 330/145
[58] Field of Search ............... 381/104, 106, 109, 98, 381/94; 333/28 T, 28 R; 307/264; 330/284, 144, 145; 341/118, 139

[56] References Cited

U.S. PATENT DOCUMENTS 4,731,851  3/1988  Christopher ........................ 381/104
4,736,426  4/1988  Kinoshita et al. .................. 381/98
4,899,150  2/1990  Iwamatsu ........................... 341/118

OTHER PUBLICATIONS

Radio Shack–"Linear Data Book" Cat. No. 62-1372 1976 National Semiconductor Corp. pp. 10-28, 10-32.

Primary Examiner—Jin F. Ng
Assistant Examiner—Nina Tong
Attorney, Agent, or Firm—Oblon, Spivak, McClelland, Maier & Neustadt

[57] ABSTRACT

An operational amplifier (1) and resistors (11) and (12) damp an input signal ($V_1$) by −6dB. Since a positive input terminal of the operational amplifier (1) is fixed at −3V, DC component of the input signal ($V_1$) is downshifted to −3V so that a signal ($V_2$) is obtained. The signal ($V_2$) is inputted to an electronic volume (100) wherein the signal ($V_2$) is damped thereby a signal ($V_3$) is obtained. An operational amplifier (2) and resistors (13) and (14) amplify the signal ($V_3$) by 6dB. Since a positive input terminal of the operational amplifier (2) is fixed at 0V, DC component of the signal ($V_3$) is upshifted to 0V thereby a signal ($V_5$) is obtained. The signal which is to be processed in the electronic volume has only a half voltage relative to that of the input signal.

8 Claims, 9 Drawing Sheets

SIGNAL PROCESSOR

BACKGROUND OF THE INVENTION

1. Field of the Invention

The present invention relates to all fields where a signal is processed.

2. Description of the Prior Art

FIG. 11 is a circuit diagram illustrating an example of a conventional electronic volume circuit.

A ladder resistor 4 comprises resistors $R_1, R_2, \ldots,$ and $R_n$. A group of analog switches 3 comprises analog switches $S_1, S_2, \ldots,$ and $S_n$. The group of analog switches 3, together with the ladder resistor 4, forms an electronic volume 100. Supply voltages $+V_{CC}$ and $-V_{CC}$ are supplied to operational amplifiers 1 and 2. Resistors 5 and 6 are connected with the operational amplifiers 1 and 2, respectively. The resistors 5 and 6 determine potential level of DC component of input signals to be fed to the operational amplifiers 1 and 2, respectively. The operational amplifiers 1 and 2 serve as buffer amplifiers for the electronic volume 100.

Capacitors 7, 8 and 9 are provided for AC coupling.

When this electronic volume 100 is employed in an audio circuit, a signal to be processed therein usually oscillates between $-7$ V and $+7$ V. Therefore, positive supply voltage $+V_{CC}$ is set at $+7$ V, while the negative supply voltage $-V_{CC}$ is set at $-7$ V. The supply voltages $+V_{CC}$ and $-V_{CC}$ are also given to the group of analog switches 3.

FIG. 12 conceptually illustrates waveforms representing signals to be processed in the audio circuit. The signals oscillate around the axis at a ground level (GND level), i.e., 0 V which is a median value between supply voltages $+V_{CC}$ and $-V_{CC}$. A waveform $W_1$ represents a signal which has a relatively small amplitude, while a waveform $W_2$ represents a signal which has an approximately maximum amplitude. Even if a signal has a maximum amplitude (from $-7$ V to $+7$ V), some amount of the voltage is consumed in the buffer amplifiers 1 and 2. When about 1 V of the voltage is consumed, the maximum amplitude of the signal turns to 12 $V_{P-P}$ as represented by the waveform $W_2$.

The operational amplifiers 1 and 2 generally has a bipolar semiconductor structure. It is well-known that this structure has an excellent performance capacity. Since the bipolar semiconductor structure generally provides from 16-volt to 20-volt breakdown voltage, the bipolar semiconductor structure can be employable in the audio circuit which requires breakdown voltage of about 14 V, i.e., the difference between the positive and the negative supply voltages.

The analog switches $S_1, S_2, \ldots,$ and $S_n$, on the other hand, preferably have a CMOS (complementary metal oxide semiconductor) structure. An analog switch having the CMOS structure can provide a superior performance which will be more fully described later. Breakdown voltage of the CMOS structure is generally about 8 V. Therefore, when the required breakdown voltage is about 14 V as is in the case of the audio circuit, there is a need for conducting an extra process for obtaining high breakdown voltage such as a step of enlarging dimensions of elements, for example.

Such an extra process complicates the whole processes of integrating the operational amplifiers 1 and 2 and the electronic volume 100 to thereby produce a BiCMOS (bipolar complementary metal oxide semiconductor) structure.

SUMMARY OF THE INVENTION

According to the present invention, a signal processor comprising a first processing part for damping AC component of an input signal, while shifting DC component of the input signal to a first direction so as to generate a first processing signal, a second processing part for processing the first processing signal so as to generate a second processing signal and a third processing part for shifting DC component of the second processing signal to a second direction which is opposite to the first direction, while amplifying AC component of the second processing signal so as to generate a third processing signal.

Preferably, the input signal is an analog signal.

Furthermore, the first and the third processing parts preferably comprise respective operational amplifiers.

The input signal is damped and level-shifted in the first processing part so that the signal oscillates within the range of breakdown voltage of the second processing part. In other words, the first processing part makes signal processing operable in the second processing part.

The second processing signal is amplified and level-shifted in the third processing part. The third processing part thus compensates the operation conducted in the first processing part.

The first and third processing parts can process an analog signal. In this case, both processing parts can be easily formed with operational amplifiers.

According to the present invention, as described above, the signal processor comprises the first processing part for damping AC component of an input signal, while shifting DC component of the input signal to the first direction so as to generate the first processing signal, the second processing signal for processing the first processing signal so as to generate the second processing signal and the third processing part for shifting DC component of the second processing signal to the second direction which is opposite to the first direction, while amplifying AC component of the second processing signal so as to generate the third processing signal. Since the signal processor in accordance with the present invention is thus structured, a signal whose amplitude exceeds breakdown voltage of the second processing part can be processed therein.

Furthermore, an analog signal is employed as an input signal. The first and third processing parts can be easily formed with operational amplifiers which handle an analog signal so that both processing parts can process an analog signal.

The object of the present invention is therefore to provide a signal processor which can process a signal whose amplitude exceeds breakdown voltage of the processing part thereof.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
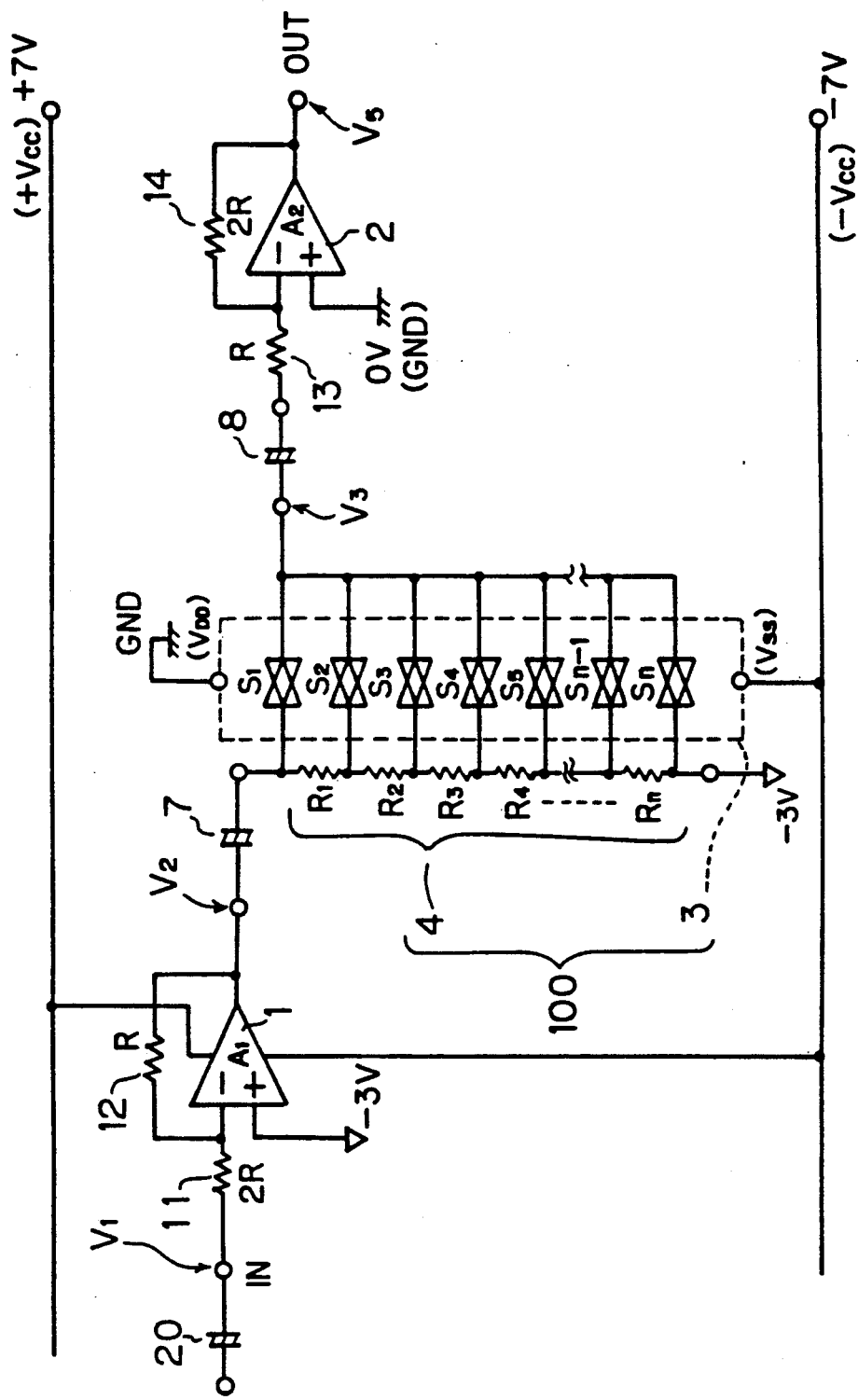
FIG. 1 is a circuit diagram showing a first preferred embodiment of the present invention.

FIG. 1 is a circuit diagram showing a first preferred embodiment of the present invention. In the first preferred embodiment, the present invention is applied to an electronic volume in which a dual-power-supply system is employed. An operational amplifier 1, together with resistors 11 and 12, forms a negative feedback circuit, and amplification degree thereof is given as follows:

$$\left| \frac{R}{2R} \right| = \frac{1}{2} = -6 \text{dB} \quad (1)$$

A signal $V_1$ is inputted to an input terminal IN, and is thus damped to $-6$ dB in the negative feedback circuit. Since the positive input terminal of the operational amplifier 1 is fixed at $-3$ V, the axis of oscillation is down-shifted to $-3$ V.

Figure 2:
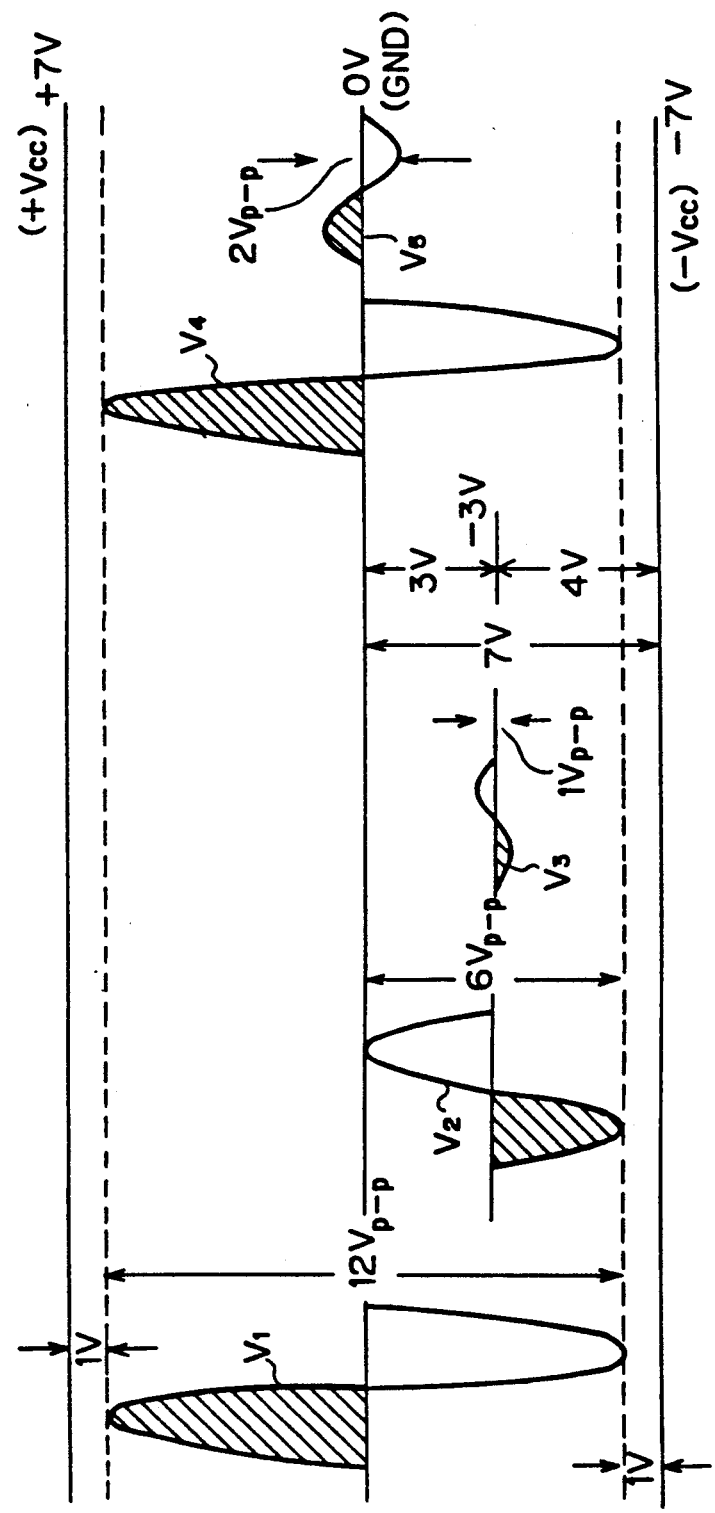
FIG. 2 illustrates waveforms representing signals which are processed in the circuit shown in FIG. 1, and is employed for describing an operation of the circuit.

When a signal having an amplitude of 12 $V_{P-P}$, but can be up to a maximum voltage of 14$Z_{P-P}$, for example, is inputted to the input terminal IN via a coupling capacitor 20, for example, there is obtained a signal $V_1$ having an axis of oscillation at 0, since the DC component thereof has been cut by the coupling capacitor 20. The signal $V_1$ is damped by $-6$ dB and down-shifted by $-3$ V in the operational amplifier 1 and the resistors 11 and 12 so that there is obtained a signal $V_2$ which has an amplitude of 6 $V_{P-P}$ and the axis of oscillation at $-3$ V. FIG. 2 illustrates waveforms which represent signals processed in the signal processor of the present invention. In FIG. 2, portions occupied with slant lines correspond to each other. The portion above 0 V on the waveform representing the signal $V_1$ is inverted to the portion below $-3$ V on the waveform representing the signal $V_2$ by function of the amplifier 1.

Since the signal $V_2$ is thus damped and shift-downed, it always oscillates under 0 V. In view of the negative voltage $-V_{CC}(-7$ V), the minimum amplitude level of the signal $V_2$ is within a permissible level. Thus the signal oscillates within breakdown voltage of an ordinary CMOS structure so that it can be processed in the electronic volume.

The signal $V_2$ is fed to the electronic volume 100 via a capacitor 7. A ladder resistor 4 divides voltage of the signal $V_2$ under the control of a group of analog switches 3, whereby the signal $V_2$ is damped.

Figure 8:
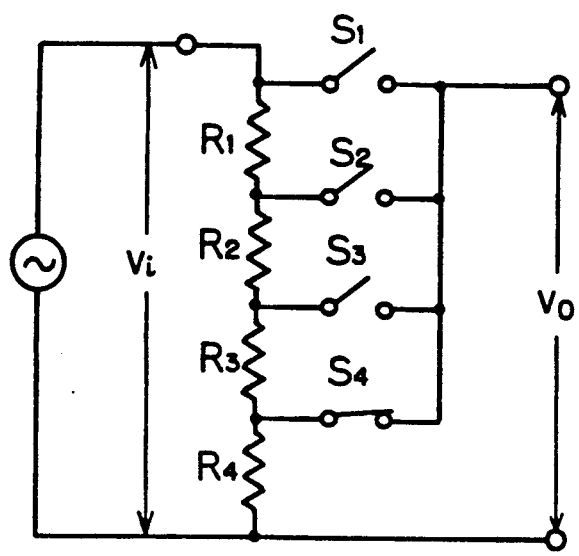
FIG. 8 is an explanatory view illustrating an electronic volume.

The operation of the analog switch is briefly described. FIG. 8 is a circuit diagram which explanatorily illustrates how voltage dividing of resistors $R_1$-$R_4$ is controlled by the switches $S_1$-$S_4$. Referring to FIG. 8, the switches $S_1$-$S_3$ are opened, while only the switch $S_4$ is closed. Therefore, input voltage vi is divided so that output voltage vO is obtained. The output voltage vO is given by the following equation;

$$vO = vi \times \frac{R_4}{R_1 + R_2 + R_3 + R_4} \quad (2)$$

Switching action of the switches $S_1$-$S_4$ controls how input voltage is divided by the resistors $R_1$-$R_4$.

Figure 3:
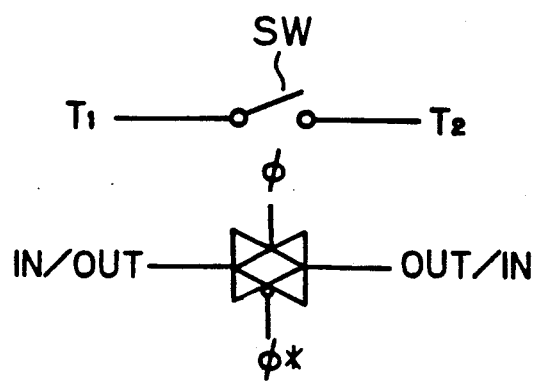
FIG. 3 illustrates respective circuit signals representing an ordinary switch and an analog switch, and is employed for describing a function of the analog switch.
Figure 4:
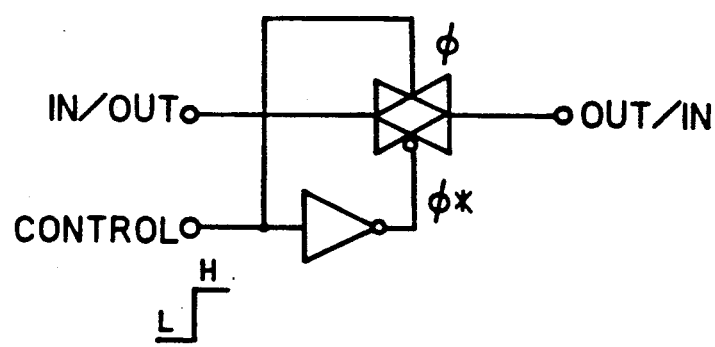
FIG. 4 is an explanatory view illustrating the analog switch.

An analog switch is usually employed to enable an electrical switching action. The analog switch comprises a CMOS element which is called as a transmission gate. FIG. 3 illustrates a circuit signal representing the transmission gate as well as a circuit signal representing an ordinary switch SW. Terminals IN/OUT and OUT/IN of the transmission gate correspond to edges $T_1$ and $T_2$ of the switch SW, respectively. When a gate input $\phi$ is at an H level (a signal $\phi^*$ which is in reverse to the gate input $\phi$ is at an L level), terminals IN/OUT and OUT/IN continue in two ways. When the gate input $\phi$ is at an L level (the reversing signal $\phi^*$ is at an H level), the terminals IN/OUT and OUT/IN do not continue. Specifically, the transmission gate is controlled by receiving two gate inputs as shown in FIG. 4; the gate input $\phi$ which is a signal from the control terminal CONTROL and the gate input $\phi^*$ which is obtained by inverting the gate input $\phi$ in an inverter.

Figure 5:
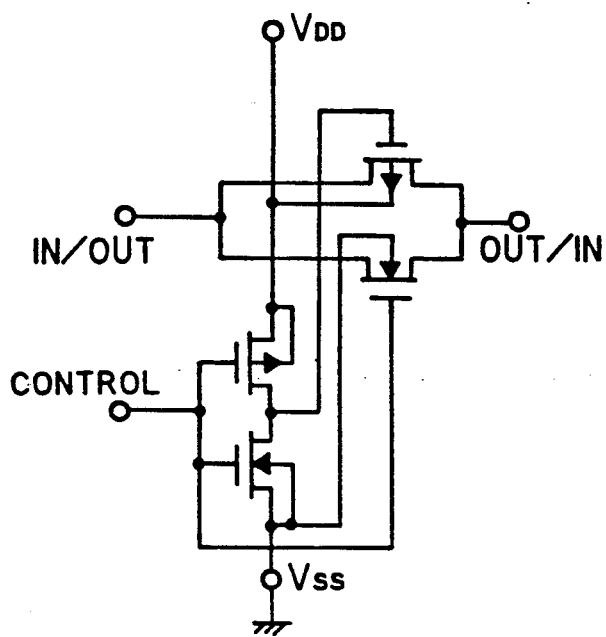
FIG. 5 is another explanatory view illustrating the analog switch.

4016P having a CMOS structure is well-known as an analog switch which comprises the above-described transmission gate, and has been widely used as a prototype of an analog switch. FIG. 5 shows an example of analog switch which comprises a CMOS element.

Figure 6:
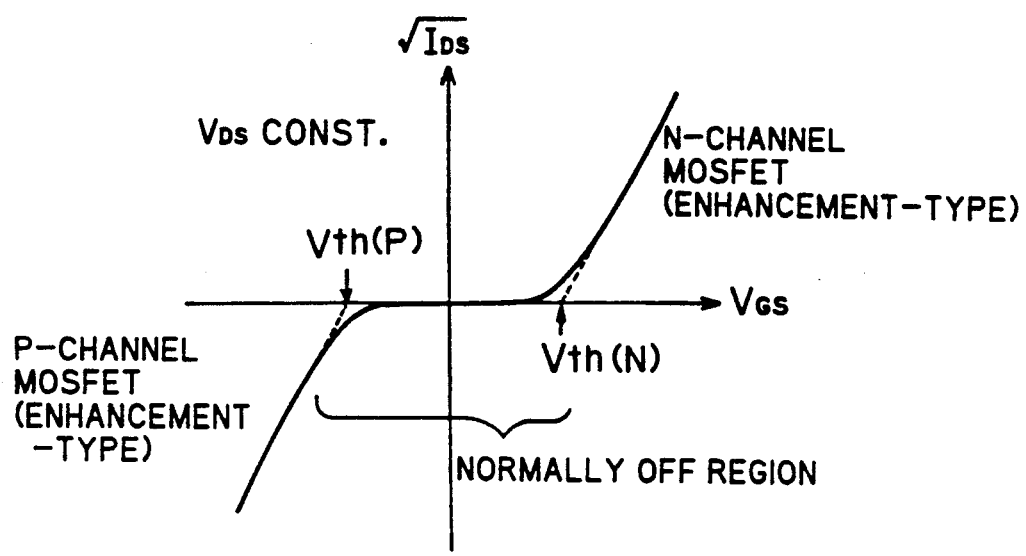
FIG. 6 is a graph which illustrates a relation between square root of drain current and gate-source voltage, and is employed for describing the function of the analog switch.
Figure 7:
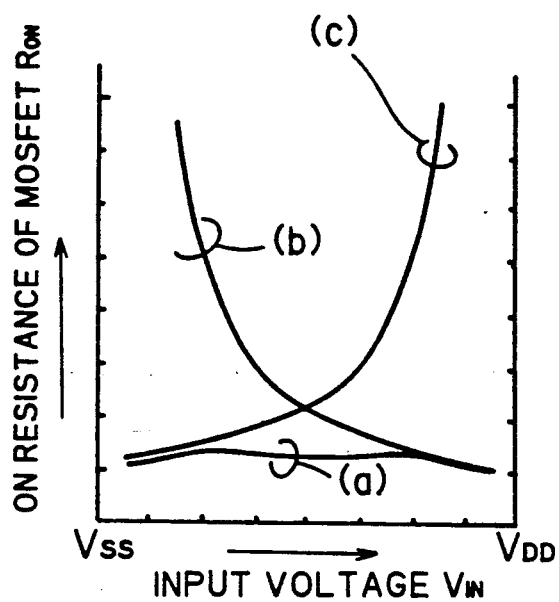
FIG. 7 illustrates relations between ON resistance of MOSFETs and input voltage, and is employed for describing the function of the analog switch.

FIG. 6 is a graph illustrating a relation between square root $I_{DS}^{\frac{1}{2}}$ of drain current and gate-source voltage $V_{GS}$. With an enhancement-type N-channel MOSFET (metal oxide semiconductor field effect transistor), drain current $I_{DS}$ does not flow (a normal-off region) under condition in which gate-source voltage is set below threshold voltage $V_{th}(N)$. Similarly, an enhancement-type P-channel MOSFET turns on and off according to whether gate-source voltage $V_{GS}$ is below or above threshold voltage $V_{th}(P)$. When the N-channel MOSFET or the P-channel MOSFET is employed alone, resistance between the source and the drain under ON-state (ON resistance) is determined by voltage $V_{DS}$ applied between the source and the drain. With the structure shown in FIG. 5, on the other hand, respective ON resistances of the N-channel MOSFET and of the P-channel MOSFET are synthesized. The synthesized ON resistance does not depend on voltage $V_{IN}$ which is applied between the terminals IN/OUT and OUT/IN, as is represented by a graph (a) shown in FIG. 7 which presents a flat configuration. Such a stable ON resistance is a desirable characteristic in view of performance capacity of the switch. Since the N-channel MOSFET and the P-channel MOSFET work complementarily and symmetrically to each other, as shown in FIG. 6, they present respective characteristics illustrated in FIG. 7 (they are represented by graphs (c) and (b), respectively).

Referring to FIG. 1 again, the electronic volume 100 comprises an ordinary CMOS structure. The signal $V_2$ is damped in the electronic volume 100; volume is adjusted therein, for example. The signal $V_2$ is damped in the electronic volume 100 so that the signal $V_3$ shown in FIG. 2 is obtained. When the signal $V_2$ is damped by one-sixth time, for example, the signal $V_3$ having an amplitude of 1 $V_{P-P}$ is obtained. Since the DC component of the signal $V_2$ is once cut by the capacitor 7, the lowermost resistor Rn is set at a potential of $-3$ V so that the electronic volume 100 having an ordinary CMOS structure is always actuated within the breakdown voltage (about 8 V).

The resistor Rn in the electronic volume 100 is not required to have a potential set equal to that of the positive input terminal of the operational amplifier 1. The signal $V_2$ may be directly inputted to the electronic volume 100 without employing the capacitor 7 (that is, without cutting the DC component of the signal $V_2$), for example. In such a case, the lowermost resistor $R_n$ in the electronic volume 100 may be grounded via a capacitor so that a potential of the electronic volume 100 is determined.

The signal $V_3$ damped in the electronic volume 100 is amplified and up-shifted in the operational amplifier 2 so that the damping operation as well as down-shifting operation conducted in the operational amplifier 1 is complemented in the operational amplifier 2. Since the signal $V_3$ is inputted to the resistor 13 via a capacitor 8, the DC component thereof is cut by the capacitor 8. Furthermore, since the positive input terminal of the operational amplifier 2 is grounded (at GND level), the DC component of the signal $V_2$ as a whole is up-shifted. The resistors 13 and 14 form a negative feedback circuit, and the amplification degree thereof is given as follows:

$$\left| -\frac{2R}{R} \right| = 2 = 6\text{dB} \qquad (3)$$

Thus, the circuit formed by the operational amplifier 2 and the resistors 13 and 14 functions as a compensator for the operation which is conducted in the circuit formed by the operational amplifier 1 and the resistors 11 and 12. Voltage of a signal is lowered below breakdown voltage only when the signal is processed in the electronic volume 100. Thus, the electronic volume 100 appears to have higher breakdown voltage than it actually has since a signal inputted to the input terminal IN and a signal obtained from the output terminal OUT have an equal voltage value which exceeds breakdown voltage of the electronic volume 100. Explanation is given referring to FIG. 2. If the signal $V_2$ is not damped by the electronic volume 100, the signal $V_2$ having an amplitude of 6 $V_{P-P}$ which is, for example less than 8 $V_{P-P}$ is amplified by 6 dB, while the DC component thereof is up-shifted to OV. As a result, a signal $V_4$ having an amplitude of 12 $V_{P-P}$ and DC component of OV is outputted from the output terminal OUT. That is, the signal $V_4$ is identical to the input signal $V_1$. Therefore, the damping degree obtained between the input terminal IN and the output terminal OUT is equivalent to that obtained in the electronic volume 100 (0).

On the other hand, when the signal $V_2$ is damped by one-sixth time in the electronic volume 100, the signal $V_3$ having an amplitude of 1 $V_{P-P}$ is amplified by 6 dB and the DC component thereof is up-shifted to OV so that a signal $V_5$ having an amplitude of 2 $V_{P-P}$ and the DC component of OV is outputted from the output terminal OUT. The signal $V_1$ which is inputted in the input terminal IN is taken as a reference signal. The signal $V_5$ is obtained by damping the signal $V_1$ by one-sixth time, which is equivalent to the damping degree obtained in the electronic volume 100.

As described above, the present invention is characterized in that the signal processing part having low breakdown voltage is provided between one processing part, in which DC component of an input signal is shifted to one direction, while AC component thereof is damped, and the other processing part which compensates the processing conducted in the first processing part. The signal processing part having low breakdown voltage is not limited to the electronic volume. In other words, the present invention can be applied to any kind of equipments to control levels such as a graphic equalizer or a tone controller, for example, and moreover, it can be applied to any other kind of signal processing aside from the level controlling.

Figure 9:
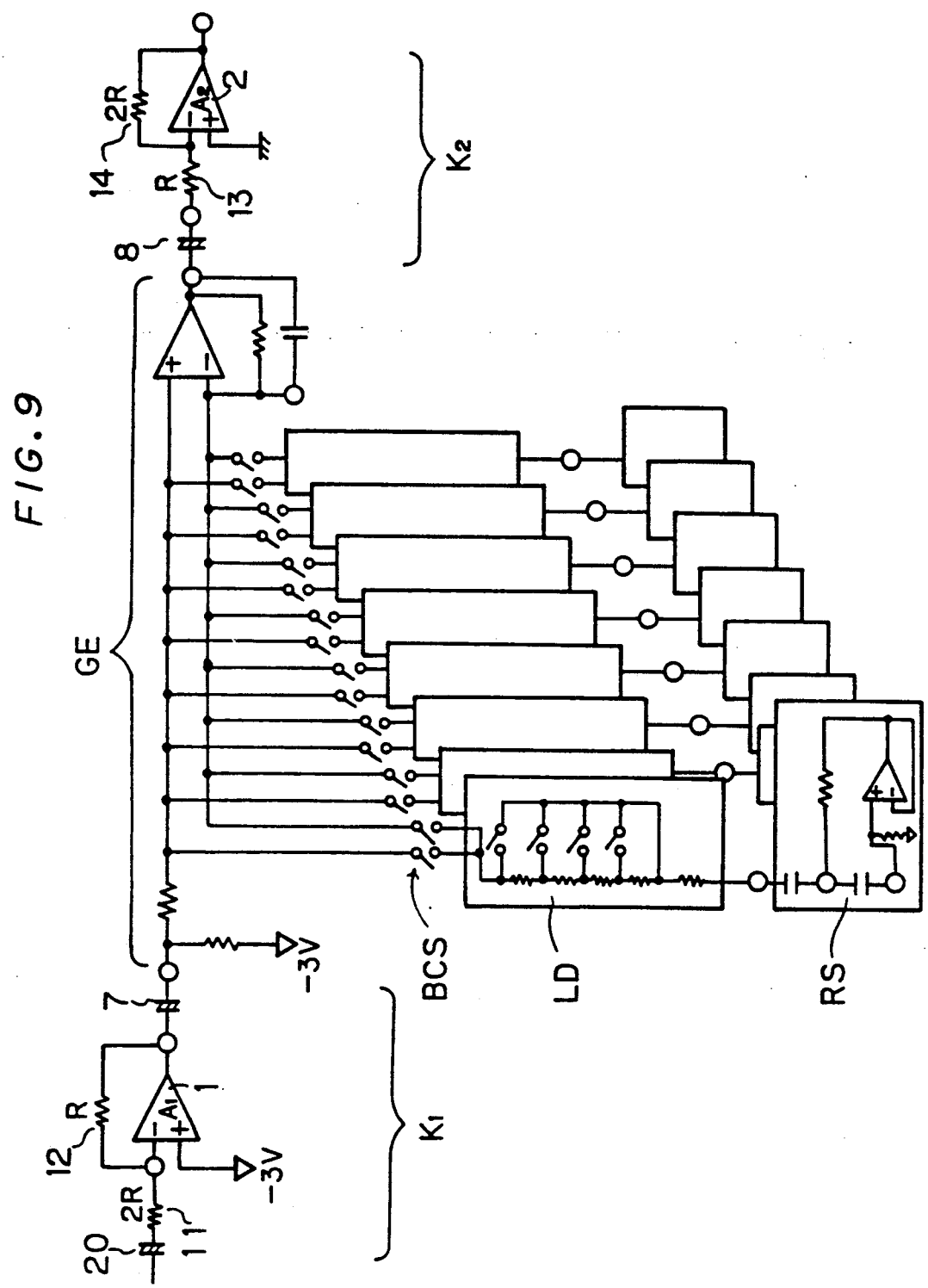
FIG. 9 is a circuit diagram showing a second preferred embodiment of the present invention.

FIG. 9 is a circuit diagram showing the second preferred embodiment of the present invention. A graphic equalizer GE comprises a boost cut transfer switch BCS, a ladder part LD and a resonance circuit RS. A circuit $K_1$ comprising an operational amplifier 1 is provided in the previous stage of the graphic equalizer. In the circuit $K_1$, similar to the example shown in FIG. 1, AC component of a signal is damped by a half time, while DC component thereof is down-shifted to $-3V$. A circuit $K_2$ is provided in the subsequent stage of the graphic equalizer GE. In the circuit $K_2$, similar to the example shown in FIG. 1, AC component of a signal is amplified, while DC component thereof is up-shifted so that the operation of the circuit $K_2$ compensates that of the circuit $K_1$. By function of the circuits $K_1$ and $K_2$, the graphic equalizer GE appears to have enough breakdown voltage to process a signal which is twice as large as a signal that can be processed with actual breakdown voltage.

Figure 10:
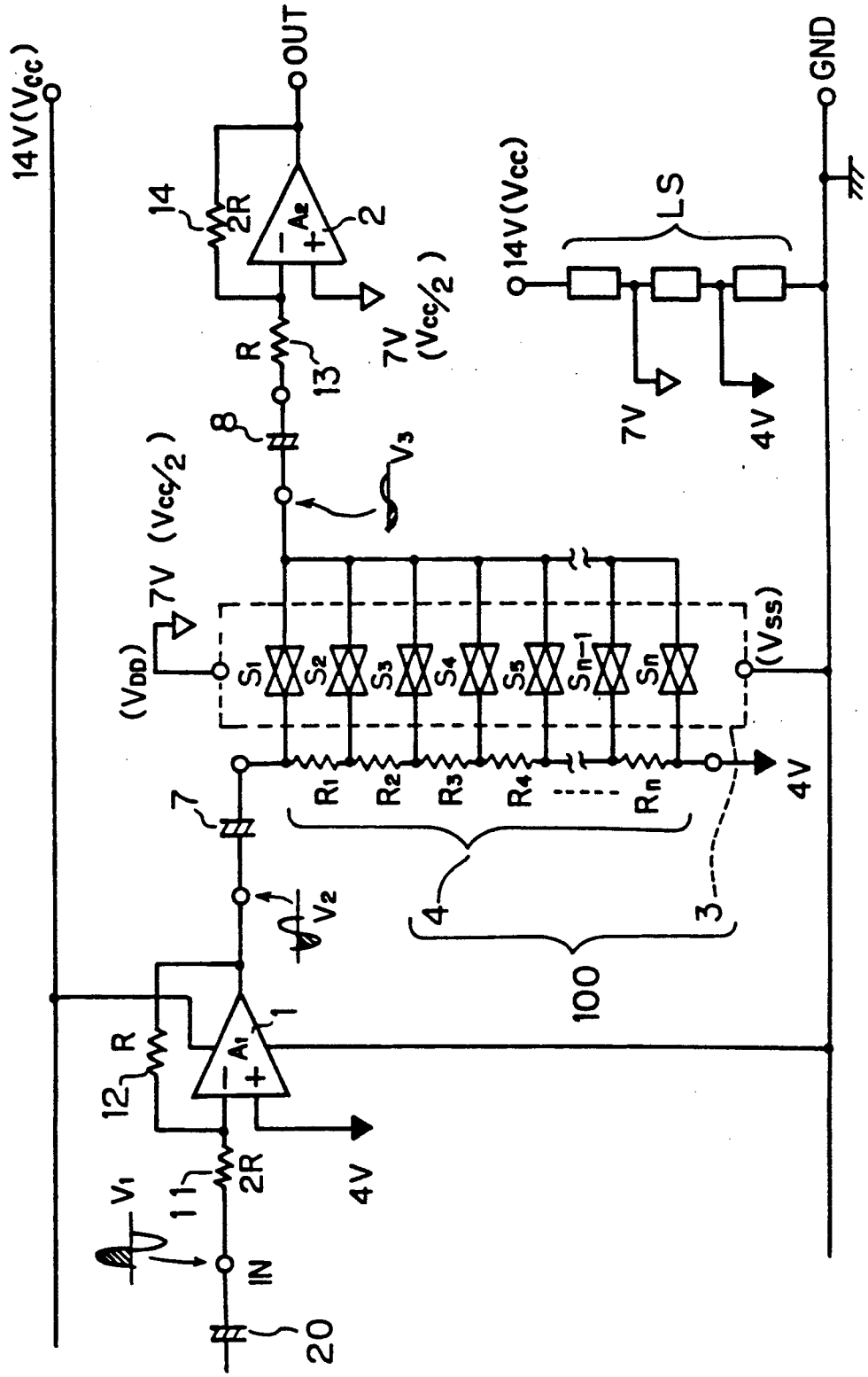
FIG. 10 is a circuit diagram showing a third preferred embodiment of the present invention.
Figure 11:
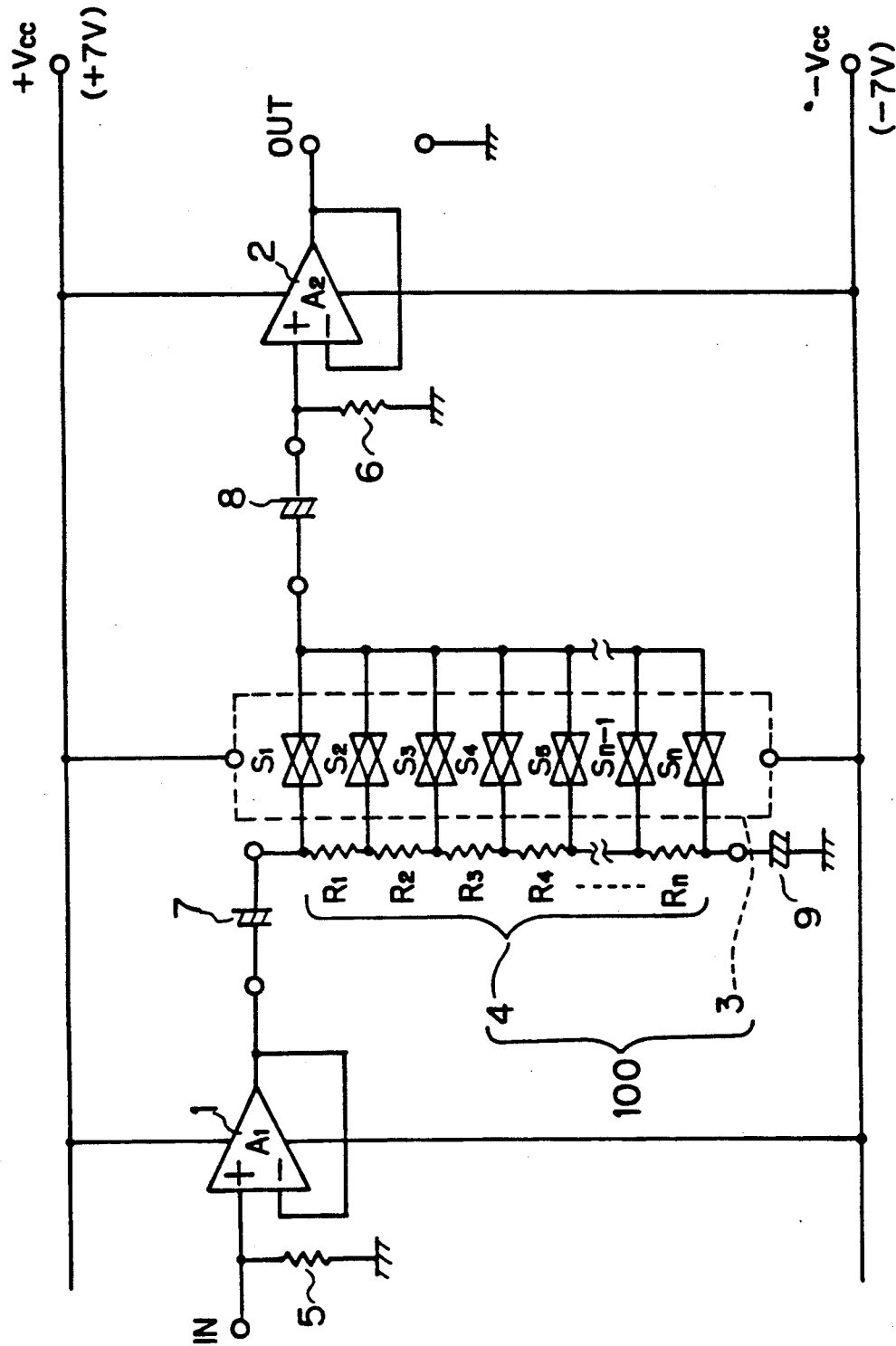
FIG. 11 is a circuit diagram illustrating a prior art.
Figure 12:
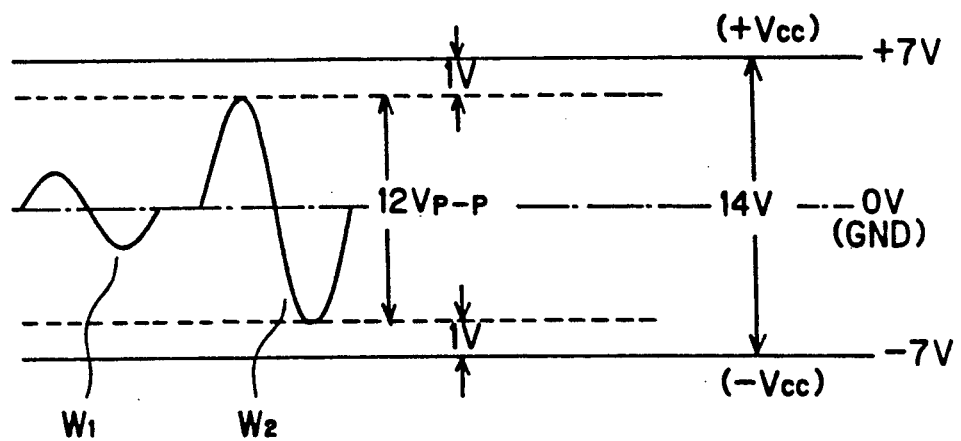
FIG. 12 illustrates waveforms representing signals processed in the electronic volume, and is employed for describing breakdown voltage of the electronic volume.

The present invention is not limited in application to a dual-power-supply system but can be also applied to a single-power-supply system. FIG. 10 is a circuit diagram illustrating the third preferred embodiment of the present invention in which the present invention is applied to a single-power-supply system. Unlike the example shown in FIG. 1, a power supply $V_{CC}$ is set at 14 V, and a potential at one end $V_{SS}$ of the electronic volume 100 is grounded instead of employing a negative power supply $-V_{CC}$. The other end $V_{DD}$ of the electronic volume 100 receives the half of the positive supply voltage $V_{CC}$, i.e., 7 V. The difference between the potentials $V_{DD}$ and $V_{SS}$ is 7 V and is equal to that in the example shown in FIG. 1.

The signal $V_1$ is inputted to the signal processor via a capacitor 20. The signal $V_1$ is usually oscillates around the axis at $V_{CC}/2$, i.e., the median value between the positive power supply $V_{CC}$ and the ground level GND. Since the positive input terminal of the operational amplifier 1 is fixed in a potential at 4 V, DC component thereof is downshifted to 4 V. AC component of the signal $V_1$, on the other hand, is damped by $-6$ dB to thereby the signal $V_2$ is obtained. Since the signal $V_2$ is inputted to the electronic volume via the capacitor 7, only the AC component of the signal $V_2$ is transmitted to the electronic volume 100. Since one end of the resistor $R_n$ in the electronic volume 100 is fixed in a potential at 4 V, the signal $V_2$ oscillates around the 4 V axis.

The signal $V_3$ damped in the electronic volume 100 is then inputted to the circuit formed by the operational amplifier 2 via the capacitor 8. Since the positive input terminal of the operational amplifier 2 is fixed in a potential at 7 V, DC component of the signal $V_3$ is upshifted to 7 V so that the signal $V_3$ oscillates around the 7 V axis. AC component of the signal $V_3$, on the other hand, is damped by 6 dB. As a result, the electronic volume 100 appears to have a breakdown voltage twice higher than it actually has.

A level shift circuit LS may be provided together with divided resistors as shown in FIG. 10 so that a potential can be fixed at 7 V or 4 V in a single power-supply system.

While the invention has been shown and described in detail, the foregoing description is in all aspects illustrative and not restrictive. It is therefore understood that numerous modifications and variations can be devised without departing from the scope of the invention.

What is claimed is:

1. A signal processor comprising:
    a first processing part for damping an AC component of an input signal by a predetermined amount, while shifting a DC component of said input signal in a first direction so as to generate a first processing signal;
    a second processing part for processing said first processing signal so as to generate a second processing signal; and
    a third processing part for shifting a DC component of said second processing signal in a second direction which is opposite to said first direction, by an amount equal to a magnitude of the shifting performed by the first processing part, while amplifying an AC component of said second processing signal by an amount equal to a reciprocal of the predetermined damping amount performed by said first processing part so as to generate a third processing signal.

2. A signal processor in accordance with claim 1, wherein:
    said input signal is an analog signal.

3. A signal processor in accordance with claim 2, wherein:
    said first and said third processing parts are formed with respective operational amplifiers.

4. A signal processor in accordance with claim 3, wherein:
    said second processing part is biased with potential at one input terminal of said operational amplifier in said first processing part.

5. A signal processor in accordance with claim 1, wherein:
    said second processing part is an electronic volume.

6. A signal processor comprising:
    a first processing part for damping an AC component of an input signal by a predetermined amount, while shifting a DC component of said input signal in a first direction so as to generate a first processing signal;
    a second processing part for processing said first processing signal so as to generate a second processing signal, said second processing part being a graphic equalizer; and
    a third processing part for shifting a DC component of said second processing signal in a second direction which is opposite to said first direction, by an amount equal to a magnitude of the shifting performed by the first processing part, while amplifying an AC component of said second processing signal by an amount equal to a reciprocal of the predetermined damping amount performed by said first processing part so as to generate a third processing signal.

7. A signal processor, comprising:
    means for generating an input signal having a maximum voltage of 14 V, peak to peak;
    a first processing part for damping an AC component of the input signal by a predetermined amount to generate a first processing signal having a voltage which is less than 8 V peak to peak;
    a second processing part comprising MOS circuitry for processing said first processing signal so as to generate a second processing signal; and
    a third processing part for amplifying an AC component of said second processing signal by an amount equal to a reciprocal of the predetermined damping amount performed by said first processing part so as to generate a third processing signal having a maximum voltage range of 14 V peak to peak.

8. A signal processor according to claim 7, wherein:
    the first processing part comprises means for shifting a DC component of said input signal in a first direction so that the first processing signal is both dampened and shifted; and
    the third processing part comprises means for shifting a DC component of said second processing signal in a second direction which is opposite to said first direction by an amount equal to a magnitude of the shifting performed by the first processing part such that the second processing signal is both shifted and amplified to form the third processing signal.

* * * * *